(12) United States Patent
Fan et al.

(10) Patent No.: US 11,776,915 B2
(45) Date of Patent: Oct. 3, 2023

(54) FPGA DEVICE FORMING NETWORK-ON-CHIP BY USING SILICON CONNECTION LAYER

(71) Applicant: WUXI ESIONTECH CO., LTD., Jiangsu (CN)

(72) Inventors: Jicong Fan, Wuxi (CN); Yanfeng Xu, Wuxi (CN); Yueer Shan, Wuxi (CN); Hua Yan, Wuxi (CN); Yanfei Zhang, Wuxi (CN)

(73) Assignee: WUXI ESIONTECH CO., LTD., Jiangsu (CN)

( * ) Notice: Subject to any disclaimer, the term of this patent is extended or adjusted under 35 U.S.C. 154(b) by 345 days.

(21) Appl. No.: 17/294,985

(22) PCT Filed: Dec. 30, 2020

(86) PCT No.: PCT/CN2020/141194
§ 371 (c)(1),
(2) Date: May 18, 2021

(87) PCT Pub. No.: WO2022/001064
PCT Pub. Date: Jan. 6, 2022

(65) Prior Publication Data
US 2022/0216156 A1 Jul. 7, 2022

(30) Foreign Application Priority Data
Jul. 1, 2020 (CN) .......................... 202010620258.7

(51) Int. Cl.
*H01L 23/538* (2006.01)
*H01L 25/065* (2023.01)
(Continued)

(52) U.S. Cl.
CPC ...... *H01L 23/5386* (2013.01); *G06F 15/7825* (2013.01); *G06F 30/347* (2020.01);
(Continued)

(58) Field of Classification Search
CPC ... H10B 80/00; G06F 15/7825; G06F 30/347; G06F 30/39; G06F 30/34; G06F 30/394; H03K 19/17736
See application file for complete search history.

(56) References Cited

U.S. PATENT DOCUMENTS 8,719,753 B1   5/2014   Chow et al.
9,059,696 B1*  6/2015   Rahman ......... H03K 19/017581
(Continued)

FOREIGN PATENT DOCUMENTS

CN   101141261   3/2008
CN   104064556   9/2014
(Continued)

OTHER PUBLICATIONS

BARE_DIE_MOUNTING.PDF, Larry Gilh, 2023, pp. 1-8.*
(Continued)

*Primary Examiner* — Victor A Mandala
*Assistant Examiner* — Lawrence C Tynes, Jr.
(74) *Attorney, Agent, or Firm* — Hamre, Schumann, Mueller & Larson, P.C.

(57) ABSTRACT

The present disclosure discloses an FPGA device forming a network-on-chip by using a silicon connection layer. An active silicon connection layer is designed inside the FPGA device. A silicon connection layer interconnection framework is arranged inside the silicon connection layer. Bare die functional modules inside an FPGA bare die are connected to the silicon connection layer interconnection framework to jointly form the network-on-chip. Each bare die functional module and a network interface and a router that are in the silicon connection layer interconnection framework form an NOC node. The NOC nodes intercommunicate with each other, so that the bare die functional modules in the FPGA bare die without a built-in NOC network can achieve (Continued)

efficient intercommunication by means of the silicon connection layer interconnection framework, reducing the processing difficulty on the basis of improving the data transmission bandwidth and performance inside the FPGA device.

8 Claims, 4 Drawing Sheets

(51) Int. Cl.
| | |
|---|---|
| *H01L 23/00* | (2006.01) |
| *H01L 23/535* | (2006.01) |
| *G06F 30/394* | (2020.01) |
| *G06F 30/39* | (2020.01) |
| *H03K 19/17736* | (2020.01) |
| *G06F 15/78* | (2006.01) |
| *G06F 30/347* | (2020.01) |
| *H10B 80/00* | (2023.01) |

(52) U.S. Cl.
CPC ............ *G06F 30/39* (2020.01); *G06F 30/394* (2020.01); *H01L 23/535* (2013.01); *H01L 24/16* (2013.01); *H01L 25/0652* (2013.01); *H03K 19/17736* (2013.01); *H03K 19/17744* (2013.01); *H01L 2224/16146* (2013.01); *H01L 2224/16227* (2013.01); *H01L 2224/16238* (2013.01); *H01L 2924/1431* (2013.01); *H01L 2924/14361* (2013.01); *H10B 80/00* (2023.02)

(56) References Cited

U.S. PATENT DOCUMENTS

| | | | | |
|---|---|---|---|---|
| 9,106,229 | B1 * | 8/2015 | Hutton | ................. H01L 23/147 |
| 10,749,528 | B2 * | 8/2020 | Atsatt | .................... G11C 15/00 |
| 2015/0109024 | A1 | 4/2015 | Abdelfattah et al. | |
| 2020/0119736 | A1 | 4/2020 | Weber et al. | |

FOREIGN PATENT DOCUMENTS

| | | |
|---|---|---|
| CN | 104243330 | 12/2014 |
| CN | 105679748 | 6/2016 |
| CN | 107431061 | 12/2017 |
| CN | 109564914 | 4/2019 |
| CN | 110010510 | 7/2019 |
| CN | 110085570 | 8/2019 |
| CN | 111755437 | 10/2020 |

OTHER PUBLICATIONS

17294985WRITTENOPINION.PDF, WIPO 2021, pp. 1-3.*
First Office Action issued for Chinese Patent Application No. 202010620258.7, dated Oct. 21, 2021, 12 pages including partial English translation.

* cited by examiner

FPGA DEVICE FORMING NETWORK-ON-CHIP BY USING SILICON CONNECTION LAYER

CROSS-REFERENCE TO RELATED APPLICATIONS

This application is a national stage of International Application No. PCT/CN2020/141194, filed on Dec. 30, 2020, which claims priority to Chinese Patent Application No. 202010620258.7, filed on Jul. 1, 2020. Both of the aforementioned applications are hereby incorporated by reference in their entireties.

FIELD OF THE INVENTION

The present disclosure relates to the technical field of FPGAs, more particular, to an FPGA device forming a network-on-chip by using a silicon connection layer.

BACKGROUND OF THE INVENTION

An FPGA (Field Programmable Gate Array) is a hardware-programmable logic device and is widely used in mobile communications, data centers, navigation guidance, automatic driving, or the like. As new applications have increasing demands on bandwidth, storage and data processing capabilities, at present, there are some practices to integrate an NOC network inside an FPGA chip to improve communication performance. However, it is difficult to make and popularize such practices at present, and such practices may take up a precious chip area.

SUMMARY OF THE INVENTION

In response to the above problems and technical needs, the present inventors have proposed an FPGA device that uses a silicon connection layer to form a network-on-chip. The technical solution of the present disclosure is as follows.

An FPGA device forming a network-on-chip by using a silicon connection layer, wherein the FPGA device includes a substrate, a silicon connection layer laminated on the substrate, and an FPGA bare die laminated on the silicon connection layer. The FPGA bare die includes at least a plurality of bare die functional modules, a silicon stack connection module and a bare die connection point leading-out terminal. The silicon stack connection module includes a plurality of bare die silicon stack connection points, and each of the bare die functional modules is connected to the bare die silicon stack connection points respectively. The bare die silicon stack connection points are connected to the corresponding bare die connection point leading-out terminal through a metal wire in a re-distribution layer. A silicon connection layer interconnection framework is arranged within the silicon connection layer, and includes routers, network interfaces and routing channels. Adjacent routers are connected through the routing channels respectively, and each of the routers is connected to one network interfaces. The bare die connection point leading-out terminals on the FPGA bare die that are connected to the bare die functional modules are connected to the network interfaces in the silicon connection layer, so that the corresponding bare die functional modules are connected to the silicon connection layer interconnection framework to form a network-on-chip. Each of the bare die functional modules is connected to one network interface in the silicon connection layer interconnection framework. The FPGA device includes a plurality of first NOC nodes for the network-on-chip, each NOC node includes one of the bare die functional modules and the network interface and router connected to one of the bare die functional modules. The first NOC nodes are interconnected through the routing channels, and the plurality of the bare die functional modules in the FPGA bare die intercommunicate with one another through the network-on-chip.

According to a further technical solution, the FPGA device includes therein a plurality of the FPGA bare dies laminated on the silicon connection layer, and the silicon connection layer covers all the FPGA bare dies. The bare die functional modules from different FPGA bare dies are connected to the silicon connection layer interconnection framework and intercommunicate with one another through the formed network-on-chip.

According to a further technical solution, the FPGA device further includes therein an artificial intelligence bare die laminated on the silicon connection layer, and the artificial intelligence bare die includes a plurality of AI engines, an AI silicon-stacked connection module and an AI connection point leading-out terminals. The AI silicon-stacked connection module includes a plurality of AI silicon-stacked connection points, and each of the AI engine is connected to the AI silicon-stacked connection points respectively. The AI silicon-stacked connection points are connected to the corresponding AI connection point leading-out terminals through a top metal wire in the re-distribution layer. The AI connection point leading-out terminals on the artificial intelligence bare die that are connected to the AI engines are connected to one network interface in the silicon connection layer, so that the AI engines are connected to the silicon connection layer interconnection framework. Each of the AI engines is connected to one network interface in the silicon connection layer interconnection framework, and the AI engine and the network interface and router connected thereto constitute a second NOC node in the network-on-chip. Each of the AI engines intercommunicates with other functional IP modules through the network-on-chip, and the other functional IP modules include other AI engines in the artificial intelligence bare die, and/or AI engines in other artificial intelligence bare dies, and/or the bare die functional modules in the FPGA bare die.

According to a further technical solution, each router in the silicon connection layer interconnection framework includes a 5*5 fully interconnected switch array and five sets of input and output ports connected thereto, wherein one set of input and output ports are connected to the corresponding network interface, and the other four sets of input and output ports are respectively arranged in four different directions and are respectively configured to be connected to adjacent routers in the four directions; and the routers form a two-dimensional interconnection array.

According to a further technical solution, a silicon connection layer functional module is further arranged in the silicon connection layer. The silicon connection layer functional module is connected to one network interface so as to be connected to the silicon connection layer interconnection framework. The silicon connection layer functional module and the network interface and router connected thereto constitute a third NOC node in the network-on-chip.

According to a further technical solution, at least two different silicon connection layer functional modules are arranged in the silicon connection layer. Each silicon connection layer functional module is connected to one network interface so as to be connected to the silicon connection layer interconnection framework, and the silicon connection layer functional module and the network interface and router connected thereto constitute a third NOC node in the network-on-chip.

According to a further technical solution, the silicon connection layer functional module includes a memory chip comprising at least one of an HBM, a DDR4 and a DDR5.

According to a further technical solution, the silicon connection layer functional module includes a FIFO configured to implement a caching function.

DETAILED DESCRIPTION OF THE INVENTION

Specific implementations of the present disclosure are further described below with reference to the accompanying drawings.

Figure 1:
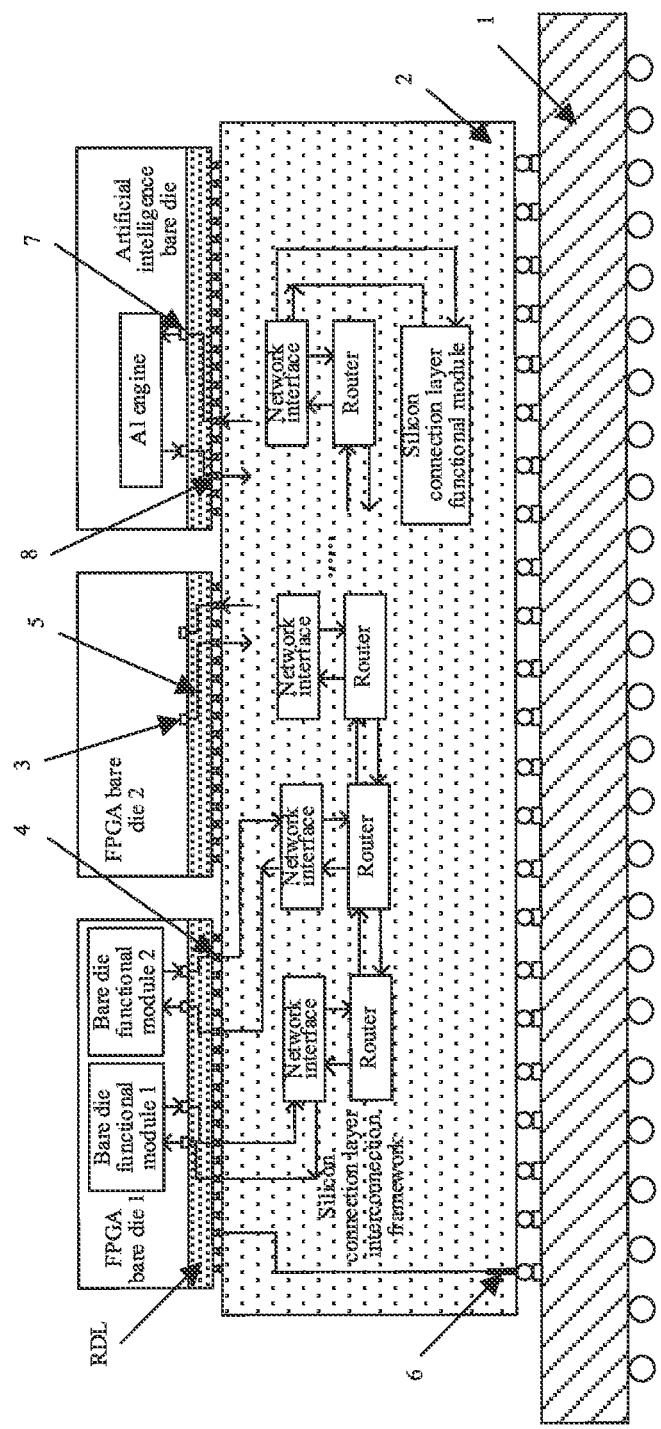
FIG. 1 is a structural sectional view of an FPGA device according to the present disclosure.

The present disclosure discloses an FPGA device forming a network-on-chip by using a silicon connection layer. Referring to FIG. 1, the FPGA device comprises a substrate 1, a silicon connection layer 2 and FPGA bare dies sequentially laminated from bottom to top. In actual implementation, the FPGA further includes a package housing for protecting various components that are packaged outside the substrate 1, the silicon connection layer 2 and the FPGA bare dies, as well as pins connected to the substrate and configured to lead out signals. Such conventional structures are not shown in detail in FIG. 1.

The FPGA bare die in the present disclosure is different from a conventional FPGA bare die. The conventional FPGA bare die mainly includes bare die functional modules such as CLBs, PLBs, BRAMs, DSPs, PCs and IOBs. Each bare die functional module has an interconnected resource module (INT) structurally identical and distributed around the bare die functional module. Horizontal or vertical connection lines between the bare die functional modules are all connected via the INT modules. However, in addition to the conventional bare die functional modules, the FPGA bare die in the present disclosure further includes specially designed silicon-stacked connection modules LNK. Each silicon-stacked connection module includes a plurality of bare die silicon-stacked connection points 3. In the FPGA bare die in the present disclosure, some conventional bare die functional modules in the conventional FPGA bare die are replaced with silicon-stacked connection modules. Moreover, conventional bare die functional modules at any position can be replaced according to signal interconnection requirements. For example, for an existing conventional column-based FPGA architecture, the FPGA bare die in the present disclosure can be obtained by arranging the silicon-stacked connection modules in a row-column structure of the CLB or by arranging the silicon-stacked connection modules in a row-column structure of the BRAM. Each silicon-stacked connection module in the FPGA bare die in the present disclosure also has an INT module distributed around the silicon-stacked connection module. Therefore, a winding structure of the FPGA bare die in the present disclosure can be consistent with the conventional FPGA bare die without any changes. Horizontal or vertical connection lines between the silicon-stacked connection modules and various other logical resources are all connected through the INT modules. The silicon-stacked connection modules LNK are directly connected to interconnection switches in the INT modules corresponding thereto, which constitutes a part of an interconnection line. The silicon-stacked connection modules LNK and the interconnection switches can be fully or partially interconnected according to connectivity requirements.

The FPGA bare die in the present disclosure further includes bare die connection point leading-out terminals 4 corresponding to the bare die silicon-stacked connection points 3, and the bare die silicon-stacked connection points 3 on the FPGA bare die are connected to the corresponding bare die connection point leading-out terminals 4 through a top metal wire 5 in a re-distribution layer (RDL layer). That is, the bare die silicon-stacked connection points 3 and the bare die connection point leading-out terminals 4 are in different planes. The bare die connection point leading-out terminals 4 are generally arranged in a row-column structure along a first direction and a second direction according to stack interconnection requirements. In addition, to achieve a larger connection bandwidth, a plurality of rows/columns of bare die connection point leading-out terminals 4 may be arranged. That is, a plurality of rows of bare die connection point leading-out terminals 4 are arranged in each FPGA bare die along the first direction, and/or a plurality of columns of bare die connection point leading-out terminals 4 are arranged along the second direction, so as to implement efficient multi-row and multi-column two-dimensional cascade. When a plurality of rows/columns of bare die connection point leading-out terminals 4 are arranged along each direction, the bare die connection point leading-out terminals may be uniformly arranged at intervals or randomly arranged. According to actual interconnection requirements, some bare die functional modules are connected to the bare die silicon-stacked connection points 3, and the bare die silicon-stacked connection points 3 are connected to the corresponding bare die connection point leading-out terminals 4 through a top metal wire in a re-distribution layer. The silicon connection layer 2 is further provided with a through-silicon via 6, and the IOB on the FPGA bare die is connected to the substrate 1 through the through-silicon via 6 on the silicon connection layer 2, so as to finally lead out signals.

Figure 2:
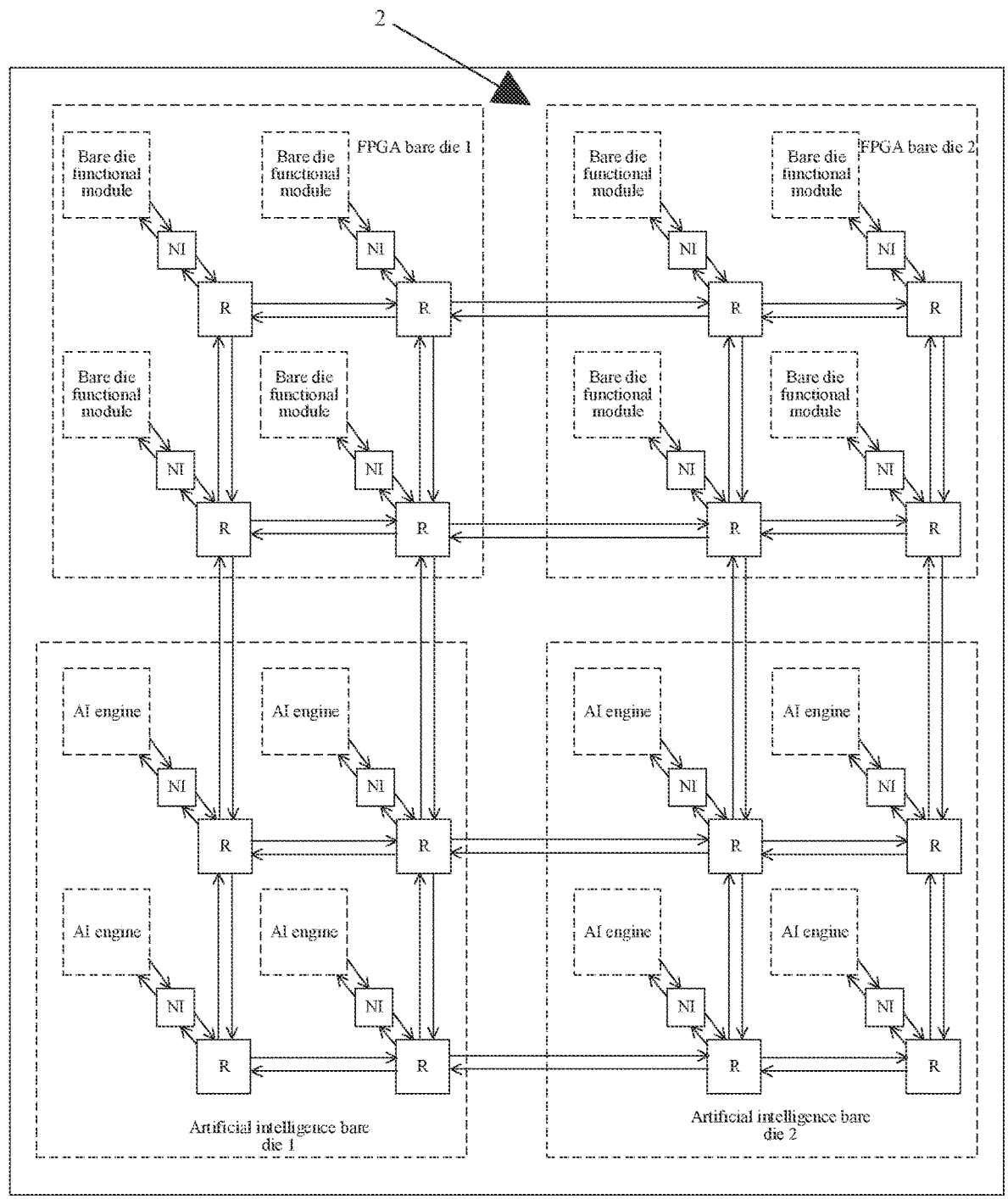
FIG. 2 is a schematic structural diagram of a network-on-chip formed by cascading an FPGA bare die and an artificial intelligence bare die with a silicon connection layer interconnection framework.
Figure 3:
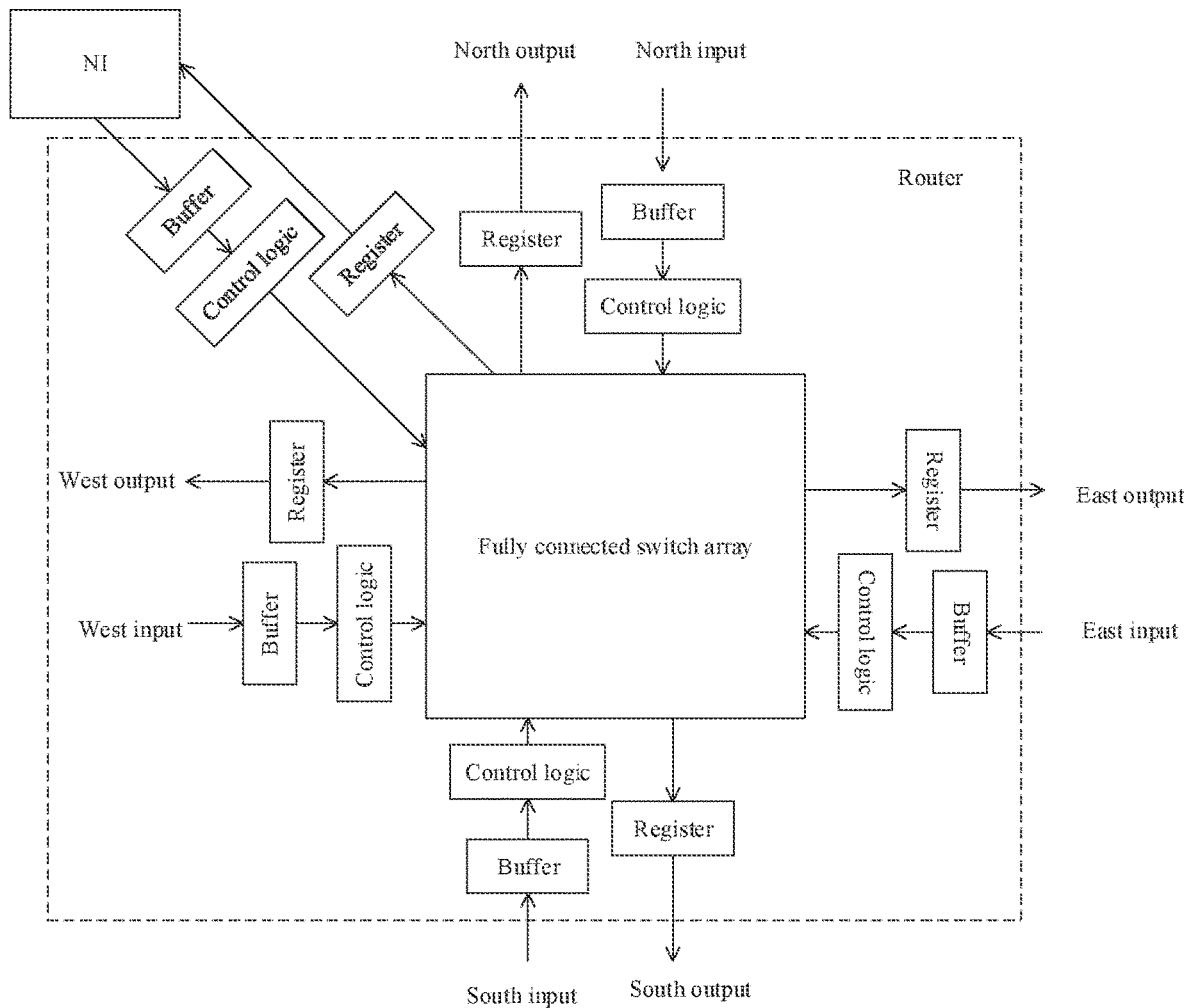
FIG. 3 is a schematic diagram of a connection structure between routers and network interfaces in the silicon connection layer interconnection framework.

A silicon connection layer interconnection framework is arranged within the silicon connection layer 2. Referring to FIG. 2, the silicon connection layer interconnection framework includes routers (R), network interfaces (NI) and routing channels. Adjacent routers (R) are respectively connected through the routing channels which are denoted by the connection lines therebetween, and each router is connected to one network interface NI. In the present disclosure, referring to FIG. 3, each router R includes a 5*5 fully interconnected switch array (cross bar in the figure) and five sets of input and output ports connected to the switch array. The fully interconnected switch array implements interconnection under the control of a corresponding control module. The specific form and control mode of the cross bar structure are conventional technologies, and are not detailed in the present disclosure. One set of input and output ports are connected to the corresponding network interface NI, while the other four sets of input and output ports are arranged in four different directions respectively, for example, East, South, West and North as shown in the figure, and are respectively configured to be connected to adjacent routers in the four directions. The set of input and output ports in each direction may be connected to any set of input and output ports in the adjacent routers. Each set of input and output ports have buffers arranged at the input ports and registers arranged at the output ports.

The bare die connection point leading-out terminals 4 on the FPGA bare die are connected to the network interfaces NI in the silicon connection layer 2, so that the bare die functional modules that are correspondingly connected to each bare die connection point leading-out terminal 4 are connected to the silicon connection layer interconnection framework to jointly form the network-on-chip. Each bare die functional module is connected to one network interface NI in the silicon connection layer interconnection framework. As shown in FIG. 2, structures inside the FPGA bare die are represented by dashed lines, and the part inside the silicon connection layer 2 are represented by solid lines. The bare die functional module and the network interface and router connected thereto constitute an NOC node in the network-on-chip. The network-on-chip includes a plurality of NOC nodes. The NOC nodes are bidirectionally interconnected through the routing channels. Each NOC node may intercommunicate with any one of the other NOC nodes through the routing channels. Thus, a plurality of bare die functional modules in an FPGA bare die without an NOC network may implement intercommunication through the network-on-chip jointly formed by the bare die functional modules and the silicon connection layer interconnection framework.

It is to be noted that the shape of the silicon connection layer interconnection framework is not limited, and it is neither necessary to lay a square structure nor necessary to lay a router on each lattice in the silicon connection layer 2. It is possible to connect adjacent routers using the routing channels. As shown in FIG. 2, lengths of the routing channels between the adjacent routers can thus vary.

Further, the FPGA device, according to an embodiment of the present disclosure, is not a single FPGA bare die structure but a multi-bare die FPGA structure. That is, the FPGA device includes a plurality of FPGA bare dies. Such a plurality of FPGA bare dies are all laminated on the same silicon connection layer 2. The silicon connection layer 2 covers all the FPGA bare dies. Such a plurality of FPGA bare dies may be arranged on the silicon connection layer 2 along a one-dimensional direction, or arranged on the silicon connection layer 2 in a two-dimensional stacked manner. That is, such FPGA bare dies are arranged along transverse and longitudinal directions on a horizontal plane. Such a plurality of FPGA bare dies can be reasonably arranged on the silicon connection layer 2, and the FPGA bare dies are arranged on the silicon connection layer 2 according to shapes and areas to make the overall area of the whole FPGA smaller. When the FPGA device includes a plurality of FPGA bare dies each having a structure as described as above, the bare die connection point leading-out terminals 4 on the FPGA bare dies are all connected to the network interfaces NI in the silicon connection layer 2, enabling the FPGA bare dies to be connected to the silicon connection layer interconnection framework, and the FPGA bare dies and the silicon connection layer interconnection framework jointly form a network-on-chip. Each bare die functional module in each FPGA bare die can intercommunicate with other bare die functional modules inside the same FPGA bare die through the network-on-chip or intercommunicate with any bare die functional module in any one of the other FPGA bare dies through the network-on-chip.

Further, the FPGA device in the present disclosure further includes an artificial intelligence bare die arranged on the silicon connection layer 2. One or more artificial intelligence bare die may be provided. The artificial intelligence bare die in the present disclosure is also different from a conventional AI bare die. The conventional AI bare die includes a plurality of AI engines. In addition to including the plurality of AI engines, the artificial intelligence bare die in the present disclosure further includes an AI silicon-stacked connection module. The AI silicon-stacked connection module includes a plurality of AI silicon-stacked connection points 7. The artificial intelligence bare die further includes AI connection point leading-out terminals 8 corresponding to the AI silicon-stacked connection points 7. Each AI engine is connected to the AI silicon-stacked connection points 7 respectively. The AI silicon-stacked connection points 7 are connected to the corresponding AI connection point leading-out terminals 8 through a top metal wire in a re-distribution layer. The AI connection point leading-out terminals 8 on the artificial intelligence bare die are connected to the network interfaces NI in the silicon connection layer 2, so that the AI engine correspondingly connected to each AI connection point leading-out terminal 8 is connected to the silicon connection layer interconnection framework, each of the AI engines is connected to one network interface NI in the silicon connection layer interconnection framework, and the AI engine and the network interface and router connected thereto also constitute an NOC node in the network-on-chip. The FPGA bare die, the artificial intelligence bare die and the silicon connection layer interconnection framework jointly constitute a complete network-on-chip. Referring to FIG. 2, structures inside the artificial intelligence bare die are represented by dashed lines, and parts inside the silicon connection layer 2 are represented by solid lines.

Figure 4:
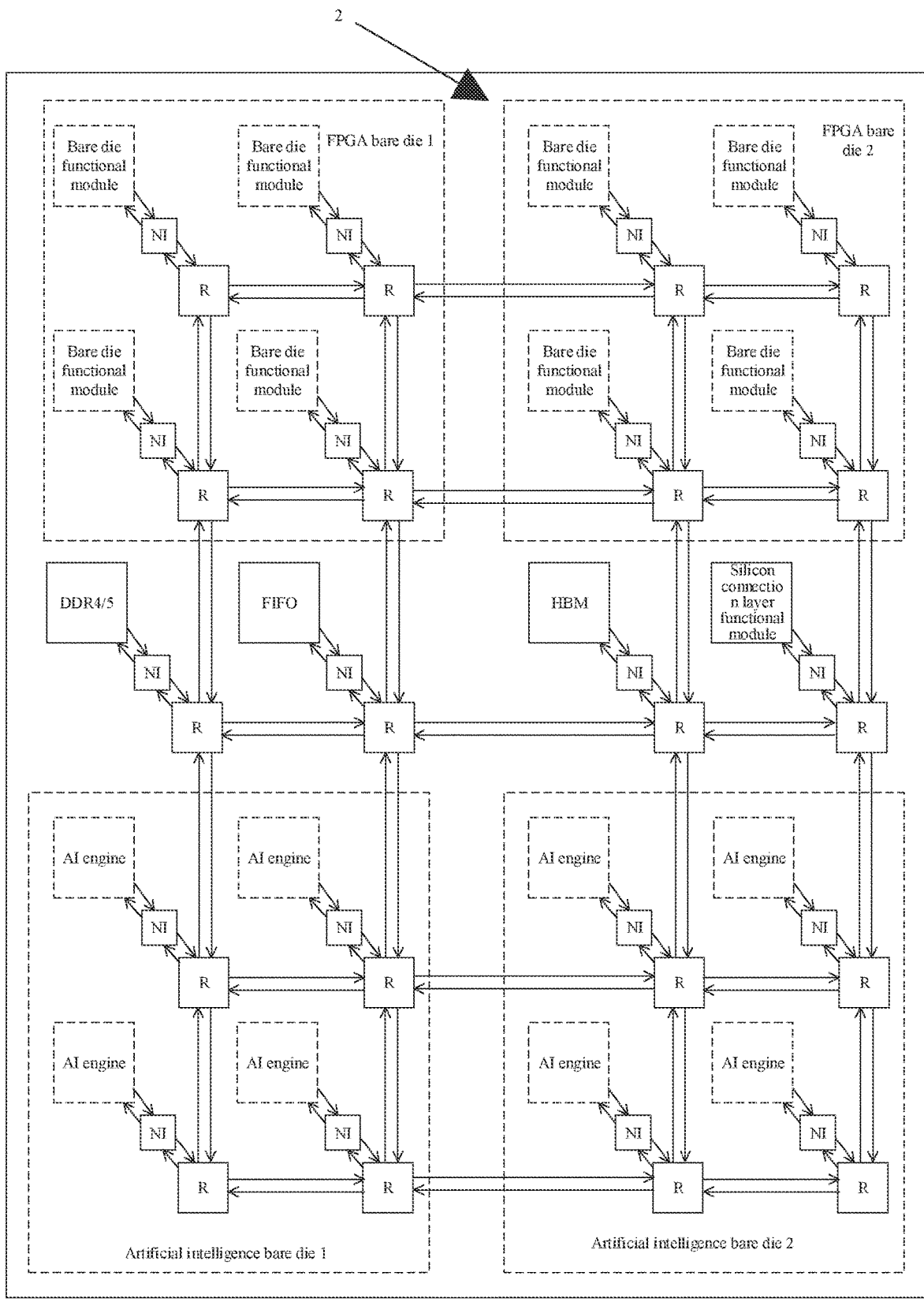
FIG. 4 is a schematic structural diagram of a network-on-chip formed by cascading an FPGA bare die, an artificial intelligence bare die and a silicon connection layer functional module with a silicon connection layer interconnection framework.

In addition, referring to FIG. 1 and FIG. 4, a silicon connection layer functional module with a network interface may be further additionally arranged in the silicon connection layer 2. The silicon connection layer functional module and corresponding network interfaces NI and routers R of the silicon connection layer interconnection framework also constitute an NOC node. At least two different kinds of silicon connection layer functional modules are arranged in the silicon connection layer 2, so as to implement different functions. As shown in FIG. 4, the silicon connection layer functional module includes a memory chip including at least one of an HBM, a DDR4 and a DDR5 and is configured to exchange data with the FPGA bare die and the artificial intelligence bare die at a high speed, which is conducive to improving the transmission bandwidth of the whole FPGA device. The silicon connection layer functional module includes FIFO configured to implement a caching function.

The embodiments of the present disclosure have the following beneficial technical effects:

An active silicon connection layer is designed inside the FPGA device according to the present disclosure. A silicon connection layer interconnection framework is arranged inside the silicon connection layer. Bare die functional modules inside an FPGA bare die are connected to the silicon connection layer interconnection framework to jointly form the network on chip. Each bare die functional module and a network interface and a router that are in the silicon connection layer interconnection framework form an NOC node. The NOC nodes intercommunicate with each other, so that the bare die functional modules in the FPGA bare die without a built-in NOC network can achieve efficient intercommunication by means of the silicon connection layer interconnection framework, reducing the processing difficulty on the basis of improving the data transmission bandwidth and performance inside the FPGA device.

A plurality of FPGA bare dies can be integrated inside the FPGA device, so that bare die functional modules in the plurality of FPGA bare dies achieve efficient intercommunication by means of the silicon connection layer interconnection framework, so as to cascade a plurality of small-scale and small-area FPGA bare dies to implement large-scale and large-area FPGA products, reduce processing difficulty, improve chip production yield and speed up design, improve the data transmission bandwidth inside the FPGA device and improve the performance of the FPGA device.

In addition, an artificial intelligence bare die may further be integrated inside the FPGA device. The artificial intelligence bare die and the FPGA bare dies can achieve efficient intercommunication by means of the silicon connection layer interconnection framework, so that the FPGA device achieve efficient applications of artificial intelligence.

Various kinds of silicon connection layer functional modules may further be additionally arranged in the silicon connection layer, which is conducive to further improving the transmission bandwidth of the whole FPGA device The above are only preferred implementations of the present disclosure, and the present disclosure is not limited to the above embodiments. It is to be understood that other improvements and changes directly derived or associated by those skilled in the art without departing from the spirit and conception of the present disclosure shall be deemed to be within the protection scope of the present disclosure.

The invention claimed is:

1. An FPGA device forming a network-on-chip by using a silicon connection layer, wherein the FPGA device comprises a substrate, a silicon connection layer laminated on the substrate, and an FPGA bare die laminated on the silicon connection layer;

the FPGA bare die comprises at least a plurality of bare die functional modules, a bare die silicon stack connection module and a bare die connection point leading-out terminal; the bare die silicon stack connection module comprises a plurality of bare die silicon stack connection points, each of the bare die functional modules is connected to the bare die silicon stack connection points respectively, and the bare die silicon stack connection points are connected to the corresponding bare die connection point leading-out terminal through a metal wire in a re-distribution layer;

a silicon connection layer interconnection framework is arranged within the silicon connection layer, the silicon connection layer interconnection framework comprises routers, network interfaces and routing channels, adjacent routers are connected through the routing channels respectively, and each of the routers is connected to one network interfaces; and the bare die connection point leading-out terminals on the FPGA bare die that are connected to the bare die functional modules are connected to the network interfaces in the silicon connection layer, so that the corresponding bare die functional modules are connected to the silicon connection layer interconnection framework to form a network-on-chip, each of the bare die functional modules is connected to one network interface in the silicon connection layer interconnection framework, wherein the FPGA device comprises a plurality of first NOC nodes for the network-on-chip, each NOC node comprises one of the bare die functional modules and the network interface and router connected to one of the bare die functional modules, the first NOC nodes are interconnected through the routing channels, and the plurality of the bare die functional modules in the FPGA bare die intercommunicate with one another through the network-on-chip.

2. The FPGA device according to claim 1, wherein the FPGA device comprises therein a plurality of the FPGA bare dies laminated on the silicon connection layer, and the silicon connection layer covers all the FPGA bare dies; and the bare die functional modules from different FPGA bare dies are connected to the silicon connection layer interconnection framework and intercommunicate with one another through the network-on-chip.

3. The FPGA device according to claim 1, wherein the FPGA device further comprises therein an artificial intelligence bare die laminated on the silicon connection layer, the artificial intelligence bare die comprises a plurality of AI engines, an AI silicon-stacked connection module and an AI connection point leading-out terminals, the AI silicon-stacked connection module comprises a plurality of AI silicon-stacked connection points, each of the AI engine is connected to the AI silicon-stacked connection points respectively, and the AI silicon-stacked connection points are connected to the corresponding AI connection point leading-out terminals through a top metal wire in the re-distribution layer;

the AI connection point leading-out terminals on the artificial intelligence bare die that are connected to the AI engines are connected to one network interface in the silicon connection layer, so that the AI engines are connected to the silicon connection layer interconnection framework, each of the AI engines is connected to one network interface in the silicon connection layer interconnection framework, and the AI engine and the network interface and router connected thereto constitute a second NOC node in the network-on-chip; and each of the AI engines intercommunicates with other functional IP modules through the network-on-chip, the other functional IP modules comprise other AI engines in the artificial intelligence bare die, and/or AI engines in other artificial intelligence bare dies, and/or the bare die functional modules in the FPGA bare die.

4. The FPGA device according to claim 1, wherein each router in the silicon connection layer interconnection framework comprises a 5*5 fully interconnected switch array and five sets of input and output ports connected thereto, wherein one set of input and output ports are connected to the corresponding network interface, and the other four sets of input and output ports are respectively arranged in four different directions and are respectively configured to be connected to adjacent routers in the four directions; and the routers form a two-dimensional interconnection array.

5. The FPGA device according to claim 1, wherein a silicon connection layer functional module is further arranged in the silicon connection layer, the silicon connection layer functional module is connected to one network interface so as to be connected to the silicon connection layer interconnection framework, and the silicon connection layer functional module and the network interface and router connected thereto constitute a third NOC node in the network-on-chip.

6. The FPGA device according to claim 5, wherein the silicon connection layer functional module comprises a memory chip comprising at least one of an HBM, a DDR4 and a DDR5.

7. The FPGA device according to claim 5, wherein the silicon connection layer functional module comprises a FIFO configured to implement a caching function.

8. The FPGA device according to claim 1, wherein at least two different silicon connection layer functional modules are arranged in the silicon connection layer, each silicon connection layer functional module is connected to one network interface so as to be connected to the silicon connection layer interconnection framework, and the silicon connection layer functional module and the network interface and router connected thereto constitute a third NOC node in the network-on-chip.

* * * * *